(12) United States Patent
Wittmann et al.

(10) Patent No.: US 11,342,659 B2
(45) Date of Patent: May 24, 2022

(54) RADOME SUBASSEMBLY FOR A RADAR SENSOR FOR MOTOR VEHICLES

(71) Applicant: Robert Bosch GmbH, Stuttgart (DE)

(72) Inventors: Soeren Wittmann, Boeblingen (DE); Christian Hollaender, Waldbronn (DE); Saeed Arafat, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 289 days.

(21) Appl. No.: 16/748,936

(22) Filed: Jan. 22, 2020

(65) Prior Publication Data

US 2020/0243960 A1 Jul. 30, 2020

(30) Foreign Application Priority Data

Jan. 24, 2019 (DE) .......................... 102019200912.3

(51) Int. Cl.
| | | |
|---|---|---|
| *H01Q 1/42* | (2006.01) | |
| *H01Q 1/32* | (2006.01) | |
| *H05K 7/14* | (2006.01) | |
| *G01S 7/03* | (2006.01) | |
| *H01Q 17/00* | (2006.01) | |
| *G01S 13/931* | (2020.01) | |

(52) U.S. Cl.
CPC ................. *H01Q 1/42* (2013.01); *G01S 7/03* (2013.01); *H01Q 1/32* (2013.01); *H01Q 17/00* (2013.01); *H05K 7/1427* (2013.01); *G01S 13/931* (2013.01)

(58) Field of Classification Search
CPC ........ G01S 13/931; H01Q 1/42; H01Q 1/422; H01Q 1/424; H01Q 17/00
See application file for complete search history.

(56) References Cited

U.S. PATENT DOCUMENTS

| 10,367,258 B2* | 7/2019 | Tagi ........................ G01S 13/58 |
| 2004/0036645 A1* | 2/2004 | Fujieda ................... G01S 7/032 |
| | | 342/70 |
| 2005/0001757 A1* | 1/2005 | Shinoda ................... H01Q 1/42 |
| | | 342/70 |
| 2006/0290564 A1* | 12/2006 | Sasada ................... H01Q 15/24 |
| | | 342/70 |
| 2007/0159380 A1* | 7/2007 | Nagaishi ............... G01S 13/931 |
| | | 342/70 |

(Continued)

*Primary Examiner* — Peter M Bythrow

(74) *Attorney, Agent, or Firm* — Norton Rose Fulbright US LLP; Gerard Messina

(57) ABSTRACT

A radome subassembly for a radar sensor for motor vehicles, which radar sensor encompasses a radar-frequency printed circuit board having at least one antenna and a radar-frequency printed circuit alongside the antenna, the radome subassembly encompassing: a radome for covering the antenna side of the radar-frequency printed circuit board; and an absorber for radar waves in order to shield the radar-frequency printed circuit, the absorber being disposed in front of an inner side of the radome, the absorber leaving a region next to the absorber, in front of the inner side of the radome, open for a main antenna lobe of the at least one antenna, the absorber being fastened on the radome, and the radome subassembly having at least one elastic plastic element by way of which the absorber is braced movably against the inner side of the radome. A radar sensor having the radome subassembly is also described.

9 Claims, 3 Drawing Sheets

(56) References Cited

U.S. PATENT DOCUMENTS

| | | | |
|---|---|---|---|
| 2007/0241962 A1* | 10/2007 | Shinoda | H01Q 15/24 |
| | | | 342/361 |
| 2009/0135043 A1* | 5/2009 | Leblanc | H05K 9/0007 |
| | | | 342/1 |
| 2016/0231417 A1* | 8/2016 | Aoki | H01Q 15/0013 |
| 2016/0344095 A1* | 11/2016 | Tagi | G01S 13/58 |

* cited by examiner

RADOME SUBASSEMBLY FOR A RADAR SENSOR FOR MOTOR VEHICLES

CROSS REFERENCE

The present application claims the benefit under 35 U.S.C. § 119 of German Patent Application No. DE 102019200912.3 filed on Jan. 24, 2019, which is expressly incorporated herein by reference in its entirety.

FIELD

The present invention relates to a radome subassembly for a radar sensor for motor vehicles, which radar sensor has a radar-frequency printed circuit board having at least one antenna and a radar-frequency printed circuit alongside the antenna, the radome subassembly having: a radome for covering the antenna side of the radar-frequency printed circuit board; and an absorber for radar waves in order to shield the radar-frequency printed circuit. The present invention further relates to a radar sensor for motor vehicles, having a radome subassembly of this kind.

BACKGROUND INFORMATION

Driver assistance systems that encompass, for example, convenience functions such as adaptive cruise control (ACC) and safety functions such as emergency braking assistance are a way to reduce the workload on a driver of a motor vehicle. Driver assistance systems draw in particular upon measured data from radar sensors. The advantage of radar sensors is especially that with a radar sensor, a direct measurement is made of physical variables such as the distance and speed of a radar target. With a video sensor, on the other hand, an interpretation of video images, for example, takes place.

Radar sensors for motor vehicles emit high-frequency radar beams via an antenna structure, and receive the radar beams reflected at objects. The objects can be stationary or moving, and can encompass, for example, vehicles, pedestrians, bicyclists, or stationary obstacles. The distance, and an azimuth angle, of an object can be calculated based on the received radar signals. The radial speed of the object relative to the radar sensor can also be calculated. Typical radar sensors for motor vehicles operate in a frequency range of 76 to 77 GHz.

With a radar sensor, it is desirable for the high-frequency radar signals to be emitted only at specific exposed points in the radar sensor. It is further desirable to reduce, or to eliminate to the extent possible, spurious signals in the received radar signals. An absorber, which can be a component that absorbs and screens out radar waves, is used in a radar sensor in order to absorb spurious radar waves in the context of the emission and/or reception of radar signals.

A radome subassembly having an integrated absorber can be produced by staking or welding an absorber onto a radome. A radome subassembly having an integrated absorber has the advantage of particularly simple installation of the radome and the absorber on the radar sensor, since all that is necessary for that purpose is to install the radome subassembly having an integrated absorber.

SUMMARY

In order to achieve defined performance characteristics for a radar sensor, it is desirable for the absorber to be disposed at a defined distance from the antenna side of a radar-frequency printed circuit board of the radar sensor.

It is desirable in particular, in the context of a radome subassembly having an integrated absorber, to enable the absorber to maintain a defined distance from an antenna side of a radar-frequency printed circuit board of the radar sensor. It is desirable in particular to combine the advantage of particularly simple installation with the possibility of nevertheless ensuring a defined distance between the absorber and the antenna side of the radar-frequency printed circuit board.

One or several of the aforementioned objects may be achieved with example features in accordance with the present invention. Advantageous refinements and embodiments of the present invention are described herein.

Because the absorber is fastened on the radome and is braced by way of the at least one elastic plastic element movably on the inner side of the radome, it becomes possible, with the radome subassembly in an installed situation on the radar sensor, for the absorber to abut against the antenna side of the radar-frequency printed circuit board and to be pressed by the elastic plastic element against the antenna side of the radar-frequency printed circuit board. The distance between the absorber and the radar-frequency printed circuit board, in particular a defined abutment of the absorber against the radar-frequency printed circuit board, can thus be determined by the absorber. In particular, the elastic plastic element can compensate for a distance tolerance between the absorber and the radome. Any tolerance fluctuations in the shape of the radome or in the installation position of the radome subassembly on the radar-frequency printed circuit board or on a housing of the radar sensor can therefore be decoupled from the absorber by the at least one elastic plastic element, so that they have no direct influence on the distance between the absorber and the antenna side of the circuit board. This therefore makes possible simple installation of the absorber on the radar sensor, in which a defined distance between the absorber and the antenna side of the radar-frequency printed circuit board can nevertheless be ensured.

It thus becomes possible to precisely define the distance between the absorber and the antenna side of the radar printed circuit board, while at the same time making possible certain production tolerances for the radome and/or for the position of the radome relative to the radar-frequency printed circuit board which results in the radome subassembly installation situation, without leading to distance fluctuations between the absorber and circuit board which might significantly influence sensor performance with reference, for example, to sensor range. It is nevertheless possible to enable a production concept for assembling the radar sensor in which the absorber is fastened on the radome subassembly. It is thus possible in particular to use an installation process in which the radome subassembly having an integrated absorber is installed on the radar sensor in one step.

Conversely, fastening of the absorber directly on the radar-frequency printed circuit board, and subsequent separate installation of the radome, would entail an additional, laborious production step in final production of the radar sensor.

The radome subassembly can also be referred to as a "radome assembly" or "radome structure." It is a radome subassembly having an integrated absorber.

The radar-frequency printed circuit board (PCB) encompasses at least one antenna. This is thus an antenna printed circuit board, also referred to as "antenna on PCB." The radar-frequency printed circuit board can also be referred to as a high-frequency (HF) board or an antenna carrier board.

The radome is configured to cover the antenna side of the radar-frequency printed circuit board when the radome subassembly is in an installed situation on the radar sensor. The radome is preferably configured to cover the entire surface of the antenna side of the radar-frequency printed circuit board. In other words, the entire antenna side of the radar-frequency printed circuit board becomes covered.

In particular, the radome is preferably configured to shield the radar-frequency circuit in a direction perpendicular to the antenna side of the radar-frequency printed circuit board. The absorber can be configured, for example, to shield the radar-frequency circuit in a direction parallel to a main direction of a main antenna lobe of the at least one antenna.

The region left exposed by the absorber is preferably a region next to a side of the absorber.

The region left exposed can be, in particular, a region for the emission or introduction of signals from or to the at least one antenna of the radar-frequency printed circuit board.

For example, the radome can encompass on its inner side a first region in which the absorber is disposed, and can encompass a second region next to the first region, the absorber leaving the second region open in order to permit transmission and reception of radar waves by the radar sensor through the radome.

Thanks to the at least one elastic plastic element, the absorber is braced movably on the inner side of the radome or buffered movably against the inner side of the radome.

The at least one elastic plastic element is configured, for example, in the context of a disposition of the radome subassembly in an installed situation of the radome subassembly on the radar sensor, in which disposition the absorber abuts against the antenna side of the radar-frequency printed circuit board, to furnish an application pressure for pressing the absorber against the antenna side of the radar-frequency printed circuit board. The at least one elastic plastic element can, in that context, accommodate tolerances in the position of the radome relative to the radar-frequency printed circuit board. The at least one elastic plastic element is elastically deformable and, in particular, elastically compressible. The absorber is, for example, mounted in elastically flexible fashion, by way of the at least one elastic plastic element, against pressure of the absorber onto the radome.

The absorber preferably has projecting stops for abutment against the radar-frequency printed circuit board. The stops can also be referred to as "support regions" or "stop surfaces." The projecting stops make possible alignment of the absorber on the radar-frequency printed circuit board. The projecting stops preferably terminate in one plane. In other words, there exists one plane in which several projecting stops of the absorber terminate. This allows the absorber to be braced at more than just one point against the radar-frequency printed circuit board.

The projecting stops can be configured in particular to define a distance between the absorber and the radar-frequency printed circuit board. In particular, the stops can be configured to define, upon abutment against the radar-frequency printed circuit board, a distance of a region of the absorber between the projecting stops from the radar-frequency printed circuit board. It thereby becomes possible, for example, for a central region of the absorber not to abut directly against the radar-frequency printed circuit board but instead to be at a defined distance from the radar-frequency printed circuit board.

In a preferred embodiment, the absorber constitutes a cage open on one side. The open side of the cage faces away from the radome, i.e., faces toward the radar-frequency printed circuit board in the installed situation of the radome subassembly. The absorber can have, for example, an open interior space for reception of a circuit element of the radar-frequency circuit. In the installed situation of the radome subassembly on the radar sensor, for example, a circuit element of the radar-frequency circuit which is constructed or installed on the antenna side of the radar-frequency printed circuit board can be received in an exposed interior space of the absorber that is open on one side.

The at least one elastic plastic element is preferably disposed in an interstice between the radome and the absorber. The at least one elastic plastic element preferably leaves a region next to the at least one elastic plastic element, in front of the inner side of the radome, open for a main antenna lobe of the at least one antenna.

In particular, the at least one elastic plastic element can be at least one elastic spacer. The elastic spacer can be configured in particular to establish or compensate for a distance between the absorber and the radome in the installed situation of the radome subassembly on the radar sensor.

The at least one elastic plastic element is preferably at least one elastic support or brace, for example a backing or an assemblage of supports or braces. The elastic plastic element can be, in particular, an elastic spacer.

In an embodiment, the at least one elastic plastic element encompasses at least one spring, in particular a compression spring, particularly preferably a helical spring or a yoke spring. The spring can represent an elastic support.

In an embodiment, the at least one elastic plastic element encompasses at least one resilient cushion, in particular an elastic cushion. The resilient cushion can represent an elastic support.

Preferably, the radome is produced from plastic, the absorber is produced from plastic, and a plastic material of the at least one elastic element has a dielectric constant that is between a dielectric constant of a plastic material of the absorber and a dielectric constant of a plastic material of the radome. What can be achieved thereby is that the dielectric constant of the radome subassembly, including the absorber, continuously increases, or continuously decreases, or remains the same, from inside to outside. A disadvantageous discontinuity in the dielectric constant, which would be associated with a change in the profile of the dielectric constant, can thus be avoided.

The plastic material of the at least one elastic element can be an elastomeric material. The plastic material of the radome and/or the plastic material of the absorber are preferably non-resilient plastic materials.

According to a refinement of the present invention, the absorber has at least two pegs or at least two peg receptacles for interacting with corresponding countermembers of the radar-frequency printed circuit board in order to align the absorber in a direction parallel to the radar-frequency printed circuit board. The absorber preferably has at least two pegs that protrude beyond the projecting stops for abutment against the radar-frequency printed circuit board. Particularly preferably, the stops are embodied on the pegs. This makes possible a particularly compact configuration of the absorber.

The pegs or peg receptacles allow optimal positioning of the absorber relative to the at least one antenna element, or relative to the radar-frequency circuit, to be achieved. In particular, the position of the absorber can be defined in two or three dimensions. The at least one elastic plastic element can, for example, permit displacements between the absorber and radome in directions parallel to the radar-frequency printed circuit board.

The present invention further includes an example radar sensor for motor vehicles, having: a housing having a front-side housing opening; a radar-frequency printed circuit board having at least one antenna and a radar-frequency circuit alongside the antenna; and a radome subassembly of the kind described, which is disposed on the front-side housing opening of the housing, the absorber being disposed over the radar-frequency circuit, and the elastic plastic element pressing the absorber onto the antenna side of the radar-frequency printed circuit board.

Exemplifying embodiments are explained in further detail below with reference to the figures.

FIG. 1 schematically depicts a construction of a radome subassembly in an installed situation.

FIG. 2 schematically depicts a radar sensor having the radome subassembly.

DETAILED DESCRIPTION OF EXAMPLE EMBODIMENTS

Figure 1:
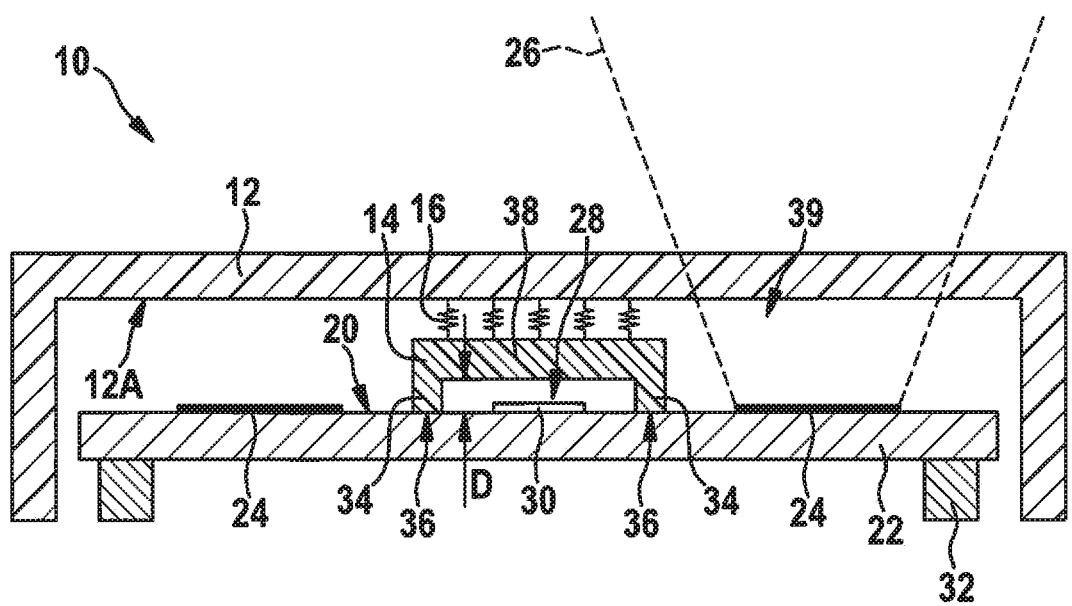

Radome subassembly 10 shown in FIG. 1 encompasses a radome 12, an absorber 14, and a symbolically depicted elastic plastic element 16 that is disposed between radome 12 and absorber 14 in an interstice between radome 12 and absorber 14. Absorber 14 is connected to radome 12, and fastened onto radome 12, via elastic plastic element 16. Elastic plastic element 16 represents an elastic support of absorber 14 on radome 12.

Absorber 12 is, for example, a plastic part produced using the injection-molding process. Radome 14 is, for example, a plastic part produced using the injection-molding process.

In the installed situation that is schematically depicted, absorber 14 abuts against an antenna side 20 of a radar-frequency printed circuit board 22. Printed circuit board 22 is an antenna-on-PCB system. An antenna structure, which can be an antenna array, is embodied on antenna side 20 of printed circuit board 22 and encompasses antennas 24.

A main antenna lobe 26 of an antenna 24 of the antenna structure is schematically depicted in FIG. 1. In the example shown, antenna structures having antennas 24 are provided on several regions of antenna side 20.

Printed circuit board 22 further encompasses a radar-frequency circuit 28 that can encompass, for example, a monolithic microwave integrated circuit (MMIC) 30.

Printed circuit board 22 is braced on a sensor housing, for example, on a printed circuit board carrier 32 of the sensor housing.

As schematically depicted, the at least one elastic plastic element 16 can generate a return force opposing movement closer to radome 12. A tolerance compensation between radome 12 and antenna side 20 of printed circuit board 22 can thereby be achieved. Absorber 14 can thus be kept at a constant distance from antenna side 20 of printed circuit board 22 even in a context of slightly different positions of radome 12, for example due to production tolerances. Absorber 14 together with radome 12 can nevertheless be installed as an integrated radome subassembly 10, in which context absorber 14 comes into abutment against antenna side 20 of printed circuit board 22.

The at least one elastic plastic element 16 has, for example, an elasticity, upon compression in a direction perpendicular to printed circuit board 22, which corresponds to a specific spring constant.

As shown schematically in FIG. 1, absorber 14 is embodied as a cage that is open on one side (toward printed circuit board 22) and encompasses projecting stops 34 having stop surfaces 36 for abutment against antenna side 20 of printed circuit board 22. Absorber 14 furthermore encompasses a central absorber portion 38 that is at a defined distance D from the surface of antenna side 20 of printed circuit board 22.

Stops 34 can be configured, for example, as walls or as a portion of an encircling wall of absorber 14, or they can project from absorber 14 toward printed circuit board 22 at individual, separate positions. Stops 34 terminate in a common plane that corresponds to the surface of antenna side 20 of printed circuit board 22. In the case of an encircling wall, stops 34 surround a pocket on the open side of absorber 14. Distance D corresponds to a depth of the pocket.

Elastic plastic element 16 is configured to press absorber 14, in the installed situation, with a constant force onto antenna side 20 of printed circuit board 22. Reliable shielding of MMIC 30 is thereby achieved.

As FIG. 1 schematically shows, absorber 14 leaves a region 39 next to absorber 14, in front of inner side 12A of radome 12, open for main antenna lobe 26 of the antenna of antenna structure 24.

Figure 2:
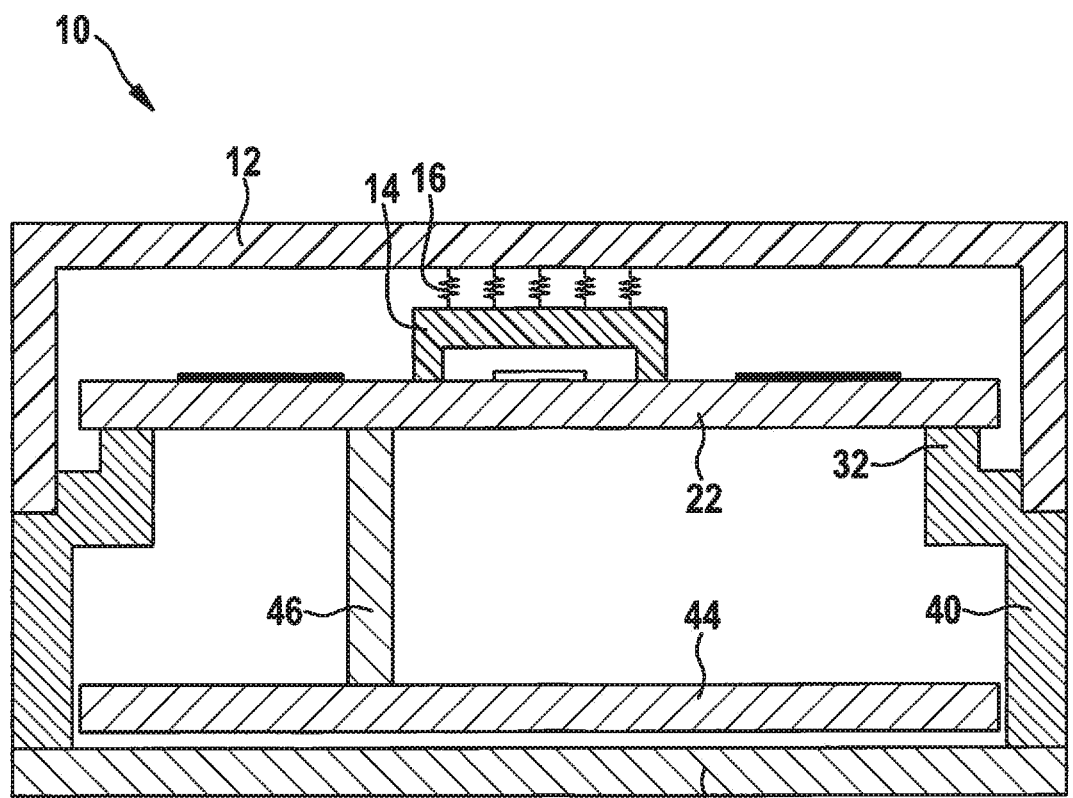

FIG. 2 schematically shows the installed situation of radome subassembly 10 on the radar sensor. The radar sensor that is depicted encompasses: radome subassembly 10 having radome 12, absorber 14, and the at least one elastic plastic element 16; an intermediate carrier in the form of a housing frame 40 on which printed circuit board 32 is embodied; a housing bottom 42; and a power printed circuit board (PCB) 44 that is connected via an electrical connector 46 to radar-frequency printed circuit board 22 on its rear side.

Figure 3:
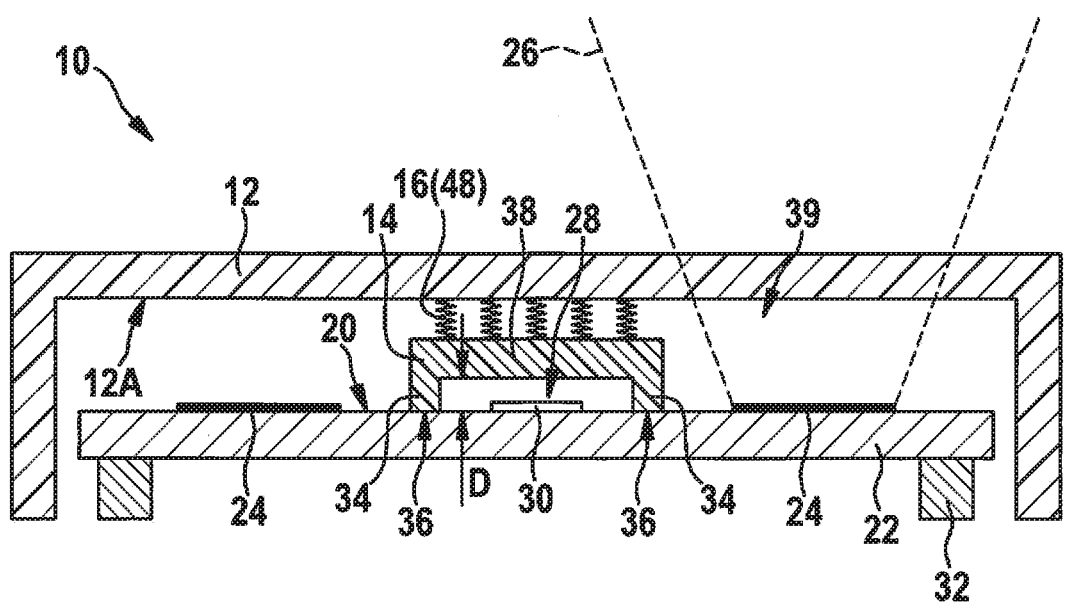
FIG. 3 shows an exemplifying embodiment of the radome subassembly in an installed situation.

In the exemplifying embodiment shown in FIG. 3, the at least one elastic plastic element 16 is configured in the form of one or several compression springs 48 made of plastic. The exemplifying embodiment otherwise corresponds to the example of FIG. 1. The dielectric constant of the material of compression springs 48 is between the dielectric constant of the material of absorber 14 and the dielectric constant of the material of radome 12.

Radome subassembly 10, having absorber 14 preinstalled via compression springs 48 on radome 12, can be installed as a preinstalled component on the radar sensor upon assembly of the radar sensor.

Figure 4:
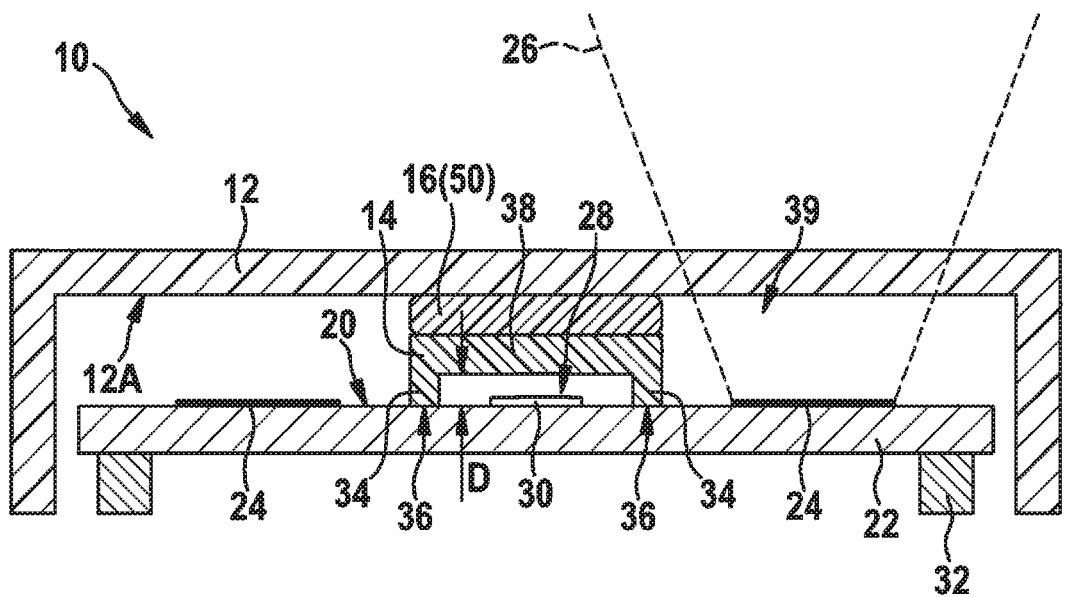
FIG. 4 shows another exemplifying embodiment of the radome subassembly in an installed situation.

In the exemplifying embodiment shown in FIG. 4, the at least one elastic plastic element is embodied as an elastomeric cushion 50. Elastomeric cushion 50 is braced, for example at two oppositely located sides over its entire surface, against radome 12 and absorber 14. The material of elastomeric cushion 50 has a dielectric constant between the dielectric constant of the material of absorber 14 and the dielectric constant of the material of radome 12. Radome subassembly 10 otherwise corresponds to the example of FIG. 1.

Figure 5:
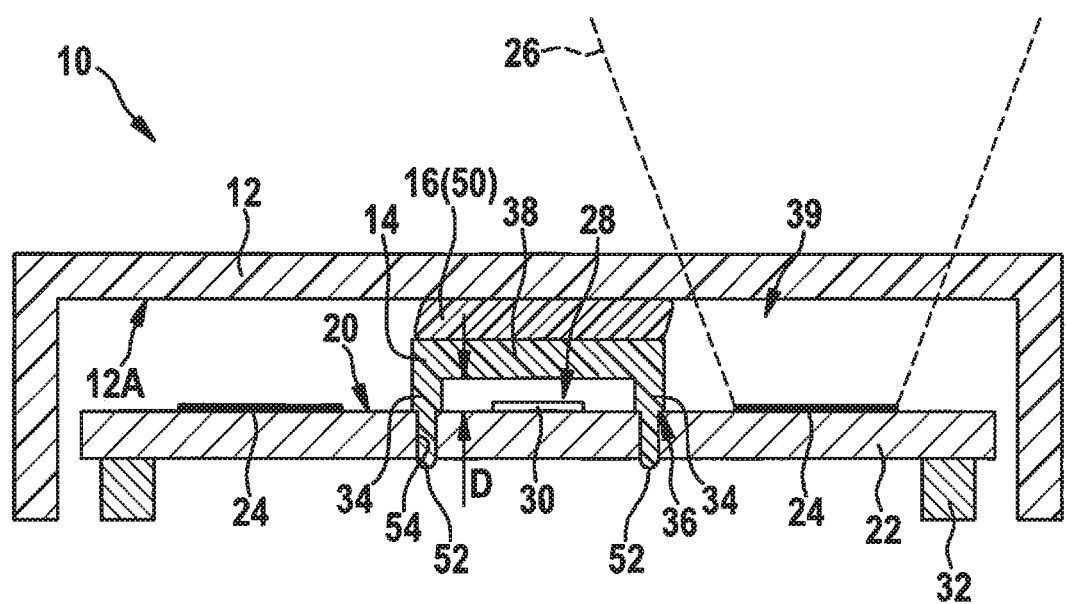
FIG. 5 shows a further exemplifying embodiment of the radome subassembly in an installed situation.

In the exemplifying embodiment shown in FIG. 5, the absorber additionally encompasses pegs 52, projecting toward printed circuit board 22, which engage positively into openings 54, for example in the form of passthrough orifices, of printed circuit board 22, and align absorber 14 on openings 54 in directions parallel to printed circuit board 22. The at least one elastic plastic element 16, for example in the form of elastomeric cushion 50, permits a compensating motion of absorber 14 in corresponding directions along inner side 12A of radome 12. Stops 34 are embodied on pegs 52, for example at the periphery of pegs 52. The exemplifying embodiment can otherwise correspond to the example of FIG. 3 or of FIG. 4.

Absorber 14 can be aligned or centered, by the interaction of pegs 52 and openings 54, in a reference position relative to printed circuit board 22.

Alternatively to the example of FIG. 5, provision can conversely be made that projecting pegs can be embodied on printed circuit board 22 on the antenna side and, in order to align absorber 14, can engage into corresponding openings on that side of absorber 14 which faces toward printed circuit board 22.

What is claimed is:

1. A radome subassembly for a radar sensor for motor vehicles, the radar sensor including a radar-frequency printed circuit board having at least one antenna and a radar-frequency printed circuit alongside the antenna, the radome subassembly comprising:
   a radome configured to cover an antenna side of the radar-frequency printed circuit board;
   an absorber for radar waves to shield the radar-frequency printed circuit, the absorber being disposed in front of an inner side of the radome, the absorber leaving a region next to the absorber, in front of the inner side of the radome, open for a main antenna lobe of the at least one antenna, the absorber being fastened on the radome; and
   at least one elastic plastic element that is arranged between the absorber and the radome and that braces the absorber movably against the inner side of the radome.

2. The radome subassembly as recited in claim 1, wherein the absorber includes:
   a surface such that, when the radome covers the antenna side of the radar-frequency printed circuit board, the surface of the absorber extends parallel to the radar-frequency printed circuit board and to the inner side of the radome, which faces towards the antenna side of the radar-frequency printed circuit board; and
   projecting stops for abutment against the radar-frequency printed circuit board, wherein the projecting stops project from the surface of the absorber away from the inner side of the radome in a direction that is perpendicular to the extension of the surface of the absorber.

3. The radome subassembly as recited in claim 1, wherein the absorber constitutes a cage that, in cross-section, is u-shaped, with an open side of the u-shape facing away from the radome.

4. The radome subassembly as recited in claim 1, wherein the at least one elastic plastic element is at least one elastic support.

5. The radome subassembly as recited in claim 1, wherein the at least one elastic plastic element includes at least one spring.

6. The radome subassembly as recited in claim 1, wherein the at least one elastic plastic element includes at least one elastic cushion.

7. The radome subassembly as recited in claim 1, wherein:
   the radome is made from plastic;
   the absorber is made from plastic; and
   a plastic material of the at least one elastic element has a dielectric constant that is between a dielectric constant of a plastic material of the absorber and a dielectric constant of a plastic material of the radome.

8. The radome subassembly as recited in claim 1, wherein the absorber includes at least two pegs or at least two peg receptacles for interacting with corresponding countermembers of the radar-frequency printed circuit board to align the absorber in a direction parallel to the radar-frequency printed circuit board.

9. A radar sensor for motor vehicles, comprising:
   a housing having a front-side housing opening;
   a radar-frequency printed circuit boards;
   at least one antenna arranged on an antenna side of the radar-frequency printed circuit board;
   a radar-frequency circuit arranged on the antenna side of the radar-frequency printed circuit board alongside the at least one antenna; and
   a radome subassembly disposed on the front-side housing opening of the housing, the radome subassembly including:
      a radome that covers the antenna side of the radar-frequency printed circuit board and that includes an inner side that faces towards the antenna side of the radar-frequency printed circuit board, the antenna side of the radar-frequency printed circuit board facing towards the inner side of the radome;
      an absorber for radar waves which is disposed over the radar-frequency circuit and below inner side of the radome, the absorber leaving a region next to the absorber, above the at least one antenna, open for a main antenna lobe of the at least one antenna, the absorber being fastened on the radome; and
      at least one elastic plastic element (a) that is arranged between the absorber and the inner side of the radome, (b) that braces the absorber against the inner side of the radome, and (c) that presses the absorber downward to abut against the antenna side of the radar-frequency printed circuit board.

\* \* \* \* \*